United States Patent
Alvine et al.

(10) Patent No.: US 10,393,885 B2
(45) Date of Patent: Aug. 27, 2019

(54) GAMMA RADIATION STAND-OFF DETECTION, TAMPER DETECTION, AND AUTHENTICATION VIA RESONANT META-MATERIAL STRUCTURES

(71) Applicant: Battelle Memorial Institute, Richland, WA (US)

(72) Inventors: Kyle J. Alvine, Richland, WA (US); Bruce E. Bernacki, Kennewick, WA (US)

(73) Assignee: Battelle Memorial Institute, Richland, WA (US)

(*) Notice: Subject to any disclaimer, the term of this patent is extended or adjusted under 35 U.S.C. 154(b) by 386 days.

(21) Appl. No.: 15/134,276

(22) Filed: Apr. 20, 2016

(65) Prior Publication Data

US 2016/0231435 A1 Aug. 11, 2016

Related U.S. Application Data

(63) Continuation-in-part of application No. 13/923,205, filed on Jun. 20, 2013, and a continuation-in-part of
(Continued)

(51) Int. Cl.
*G01B 11/26* (2006.01)
*G01T 1/06* (2006.01)
(Continued)

(52) U.S. Cl.
CPC .............. *G01T 1/06* (2013.01); *C23C 14/024* (2013.01); *C23C 14/046* (2013.01); *G02B 1/118* (2013.01);
(Continued)

(58) Field of Classification Search
CPC ........................................................ G01T 1/06
(Continued)

(56) References Cited

U.S. PATENT DOCUMENTS 5,183,700 A  2/1993  Russell
5,229,339 A  7/1993  Pujari et al.
(Continued)

FOREIGN PATENT DOCUMENTS

EP        1 241 490 A2    9/2002
JP      HEI 07-043530      5/1995
(Continued)

OTHER PUBLICATIONS

Alvine et al., "Optical Response of Oriented and Highly Anisotropic Subwavelength Metallic Nanostructure Arrays," *Applied Physics Letters*, 102:201115-1-201115-5 (May 2013).
(Continued)

*Primary Examiner* — Kara E. Geisel
*Assistant Examiner* — Omar H Nixon
(74) *Attorney, Agent, or Firm* — Klarquist Sparkman, LLP

(57) ABSTRACT

Resonant meta-material structures are defined by metallic, dielectric or other materials that form nanoshells or nanomeshes that can be situated proximate to ionizing-radiation-sensitive layers so as to provide ionizing-radiation-dose-dependent optical properties. Such meta-material structures can also define aligned or periodic, semi-random, or other arrangements of nanostructures that are coupled to or include stressed layers. Detection of optical radiation from such structures is used to determine gamma radiation dose or to detect a disturbance of the nanostructure indicating tampering.

40 Claims, 15 Drawing Sheets

Related U.S. Application Data application No. 14/815,011, filed on Jul. 31, 2015, now Pat. No. 9,580,793.

(60) Provisional application No. 61/662,275, filed on Jun. 20, 2012, provisional application No. 62/032,400, filed on Aug. 1, 2014.

(51) Int. Cl.
  *C23C 14/02* (2006.01)
  *C23C 14/04* (2006.01)
  *G02B 1/118* (2015.01)
  *G02B 1/12* (2006.01)

(52) U.S. Cl.
  CPC ......... *G02B 1/12* (2013.01); *Y10T 428/12104* (2015.01); *Y10T 428/249921* (2015.04)

(58) Field of Classification Search
  USPC .......................................................... 356/72
  See application file for complete search history.

(56) References Cited

U.S. PATENT DOCUMENTS

| | | | |
|---|---|---|---|
| 6,288,840 B1 | 9/2001 | Perkins et al. | |
| 6,979,704 B1 | 12/2005 | Mayer et al. | |
| 7,283,571 B2* | 10/2007 | Wang | H04B 10/503 372/29.02 |
| 7,683,982 B2 | 3/2010 | Cho | |
| 8,187,887 B2* | 5/2012 | Swager | G01T 1/04 250/370.07 |
| 8,274,727 B1 | 9/2012 | Yap et al. | |
| 8,512,588 B2 | 8/2013 | Tringe et al. | |
| 8,599,486 B2 | 12/2013 | Najiminaini et al. | |
| 8,905,559 B2 | 12/2014 | Kawauchi et al. | |
| 8,927,056 B2 | 1/2015 | Yamaki et al. | |
| 9,580,793 B2 | 2/2017 | Alvine et al. | |
| 2004/0047638 A1* | 3/2004 | Wang | H04B 10/503 398/196 |
| 2004/0125449 A1 | 7/2004 | Sales | |
| 2005/0078374 A1 | 4/2005 | Taira et al. | |
| 2006/0115536 A1* | 6/2006 | Yacaman | A61K 33/24 424/489 |
| 2007/0217008 A1 | 9/2007 | Wang et al. | |
| 2008/0087973 A1 | 4/2008 | Wang et al. | |
| 2008/0093557 A1* | 4/2008 | Cooke | H01L 31/02161 250/361 R |
| 2009/0253227 A1 | 10/2009 | Defries et al. | |
| 2010/0035039 A1 | 2/2010 | Jing et al. | |
| 2010/0134719 A1 | 6/2010 | Johns et al. | |
| 2010/0177380 A1 | 7/2010 | Nagahama et al. | |
| 2011/0003279 A1* | 1/2011 | Patel | G01D 3/10 435/5 |
| 2011/0012086 A1 | 1/2011 | Tsakalakos et al. | |
| 2011/0017431 A1* | 1/2011 | Yang | F28D 15/046 165/104.26 |
| 2011/0019283 A1* | 1/2011 | Steenblik | D21H 21/40 359/622 |
| 2011/0081724 A1* | 4/2011 | Swager | B82Y 15/00 436/57 |
| 2011/0107569 A1* | 5/2011 | Wang | H02N 2/18 29/25.35 |
| 2011/0223480 A1* | 9/2011 | Wee | B82Y 30/00 429/218.1 |
| 2011/0310487 A1 | 12/2011 | Nagahama et al. | |
| 2011/0312080 A1 | 12/2011 | Hatton et al. | |
| 2012/0097204 A1* | 4/2012 | Yu | B82Y 30/00 136/200 |
| 2012/0113502 A1 | 5/2012 | Suh et al. | |
| 2012/0178877 A1* | 7/2012 | Rathje | B82Y 30/00 524/770 |
| 2013/0045877 A1 | 2/2013 | Yap et al. | |
| 2013/0225760 A1 | 8/2013 | Jing et al. | |
| 2013/0232587 A1* | 9/2013 | Boday | B82Y 15/00 726/34 |
| 2013/0342898 A1 | 12/2013 | Alvine et al. | |
| 2014/0177039 A1 | 6/2014 | Li et al. | |
| 2016/0033685 A1 | 2/2016 | Alvine et al. | |

FOREIGN PATENT DOCUMENTS

| | | |
|---|---|---|
| JP | 2001-074935 | 3/2001 |
| JP | 2008-083656 | 4/2008 |
| JP | 2008-203848 | 9/2008 |
| JP | 2009-053489 | 3/2009 |
| JP | 2010-061124 | 3/2010 |
| JP | 2010-085917 | 4/2010 |
| JP | 2010-117634 | 5/2010 |
| JP | 2010-217746 | 9/2010 |
| JP | 2011-070219 | 4/2011 |
| WO | WO 2010-099805 | 9/2010 |

OTHER PUBLICATIONS

Alvine et al., "Optically resonant subwavelength films for tamper-indicating tags and seals," *Proc. of SPIE*, 9456:94560C-1-7 (May 2015).

Alvine et al., "Subwavelength films for standoff radiation dosimetry." *Proc. of SPIE*, 9455:945503-1-8 (May 2015).

Alvine et al., "Subwavelength resonant nanostructured films for sensing," *Proc. of SPIE*, 8725:87252H-1-7 (May 2013).

Arshak et al., "Effect of Radiation on Optical and Electrical Properties of Materials," Advanced Materials and Techniques for Radiation Dosimetry, Artech House Publishers, pp. 91-114 (Jun. 2006).

Arshak et al., "Gamma Radiation Sensing Using ZnO and $SnO_2$ Thick Film Interdigitated Capacitors," International Spring Seminar on Electronics Technology, pp. 483-488 (May 2006).

Arshak et al., "Thin and Thick Films of Metal Oxides and Metal Phthalocyanines as Gamma Radiation Dosimeters," *IEEE Trans. Nucl. Sci.*, 51:2250-2255 (Oct. 2004).

Arshak et al., "Various Structures Based on Nickel Oxide Thick Films as Gamma Radiation Sensors," *Sensors*, 3:176-186 (Jun. 2003).

Harvey, "Replication techniques for micro-optics," *Proc. of SPIE*, 3099:76-82, (Sep. 1997).

International Search Report from International Application No. PCT/US2013/046778, dated Dec. 16, 2013, 5 pages.

Invitation to Pay Additional Fees and Annex Form from International Application No. PCT/US2013/046778, dated Oct. 8, 2013, 6 pages.

Korgel, "Composite for smarter windows," *Nature Magazine*, 500:278-279 (Aug. 2013).

Llordes et al., "Tunable near-infrared and visible-light transmittance in nanocrystal-in-glass composites," *Nature Magazine*, 500:323-326 (Aug. 2013).

Mirin et al., "Light-Bending Nanoparticles," *Nano. Lett.*, 9:1255-1259 (Feb. 2009).

Murray et al., "Transition from localized surface plasmon resonance to extended surface plasmon-polariton as metallic nanoparticles merge to form a periodic hole array," *Physical Review B*, 69:165407-1-7 (Apr. 2004).

Notice of Reasons for Rejection from Japanese Application No. 2015-518575, dated Dec. 2, 2016, 14 pages (with English translation).

Quint et al. "A chemical route to sub-wavelength hole arrays in metallic films," *Journal of Materials Chemistry*, 19:5906-5908 (Jul. 2009).

Tsuji et al., "Self-assembly of poly (N-isopropylacrylamide)-carrying microspheres into two-dimensional colloidal arrays," *Langmuir*, 21:2434-2437 (Feb. 2005).

Written Opinion from International Application No. PCT/US2013/046778, dated Dec. 16, 2013, 8 pages.

Office Action for related EP App. No. 13736685.2, dated Mar. 28, 2019, 5 pages.

* cited by examiner

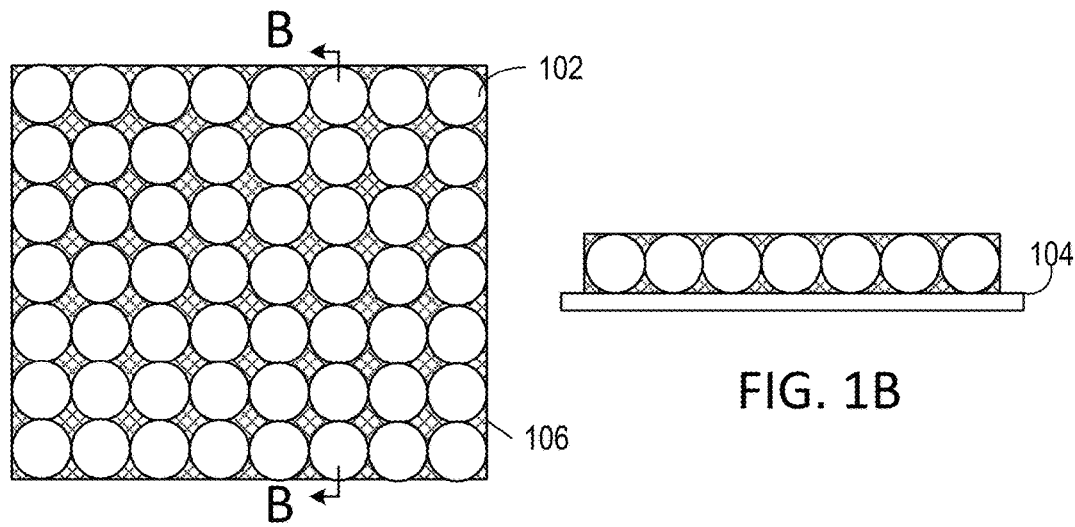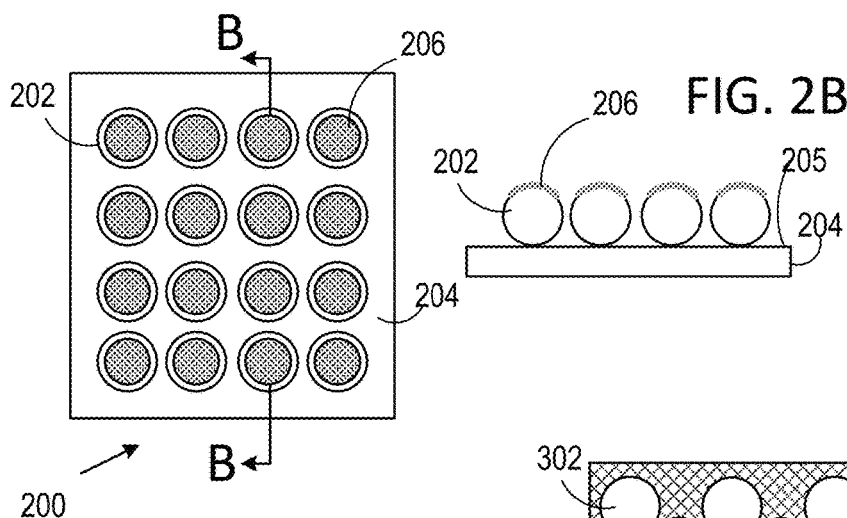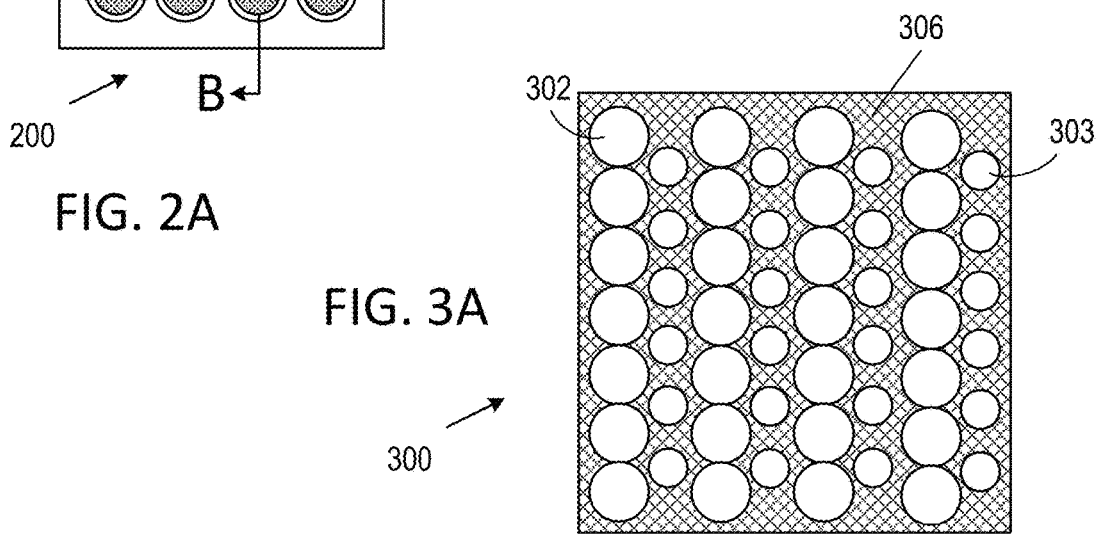

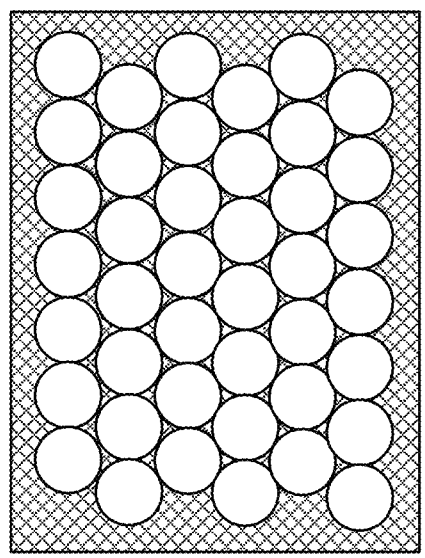
FIG. 3B
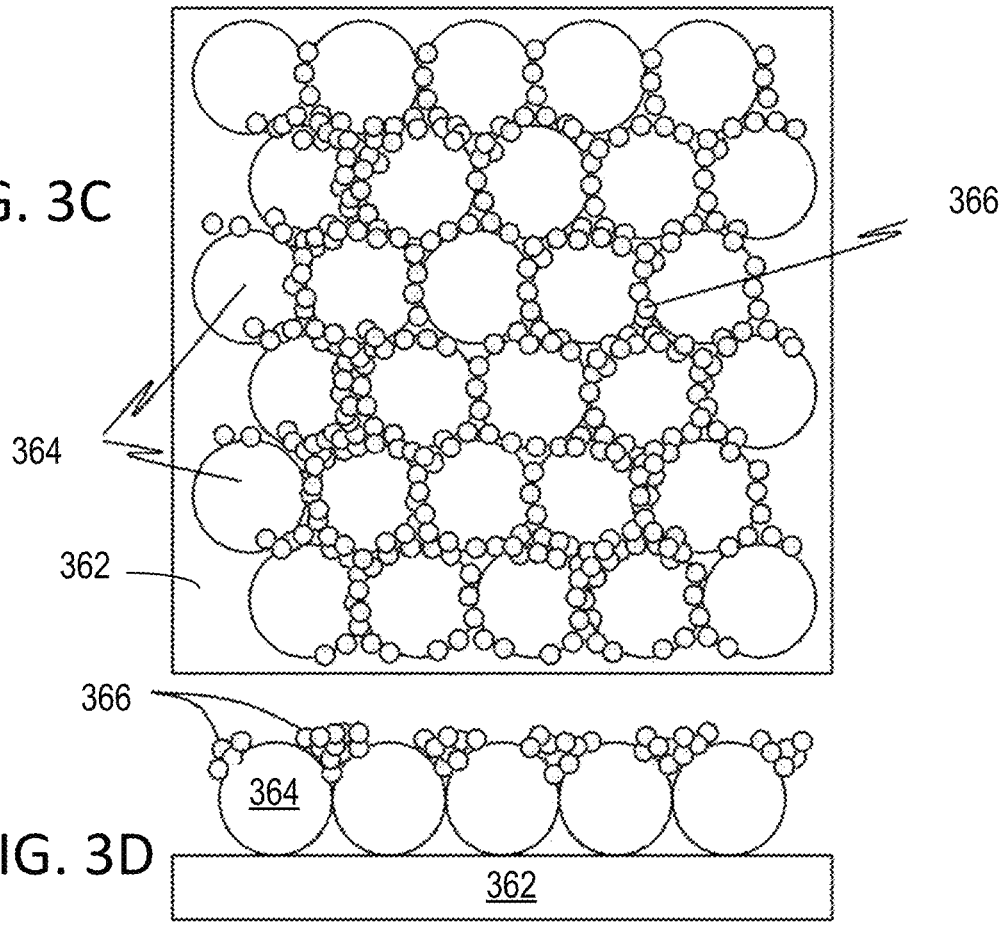
FIG. 3C
FIG. 3D

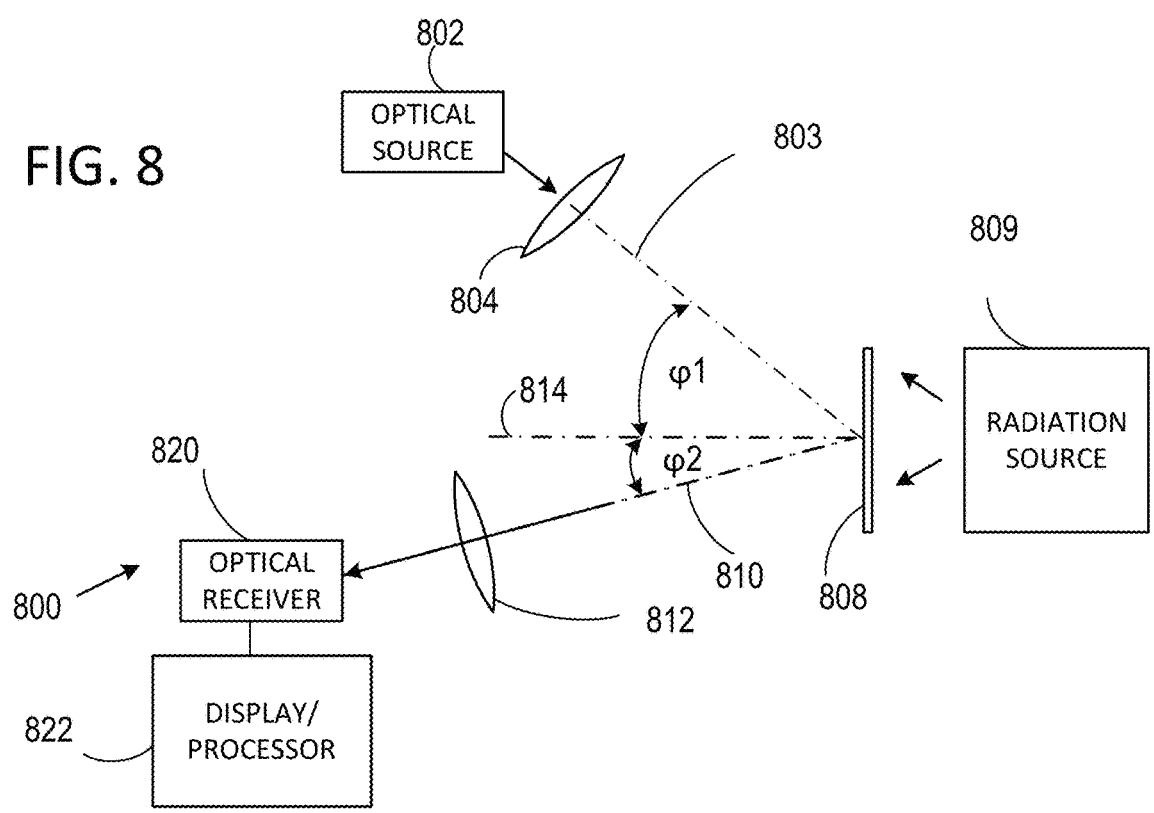

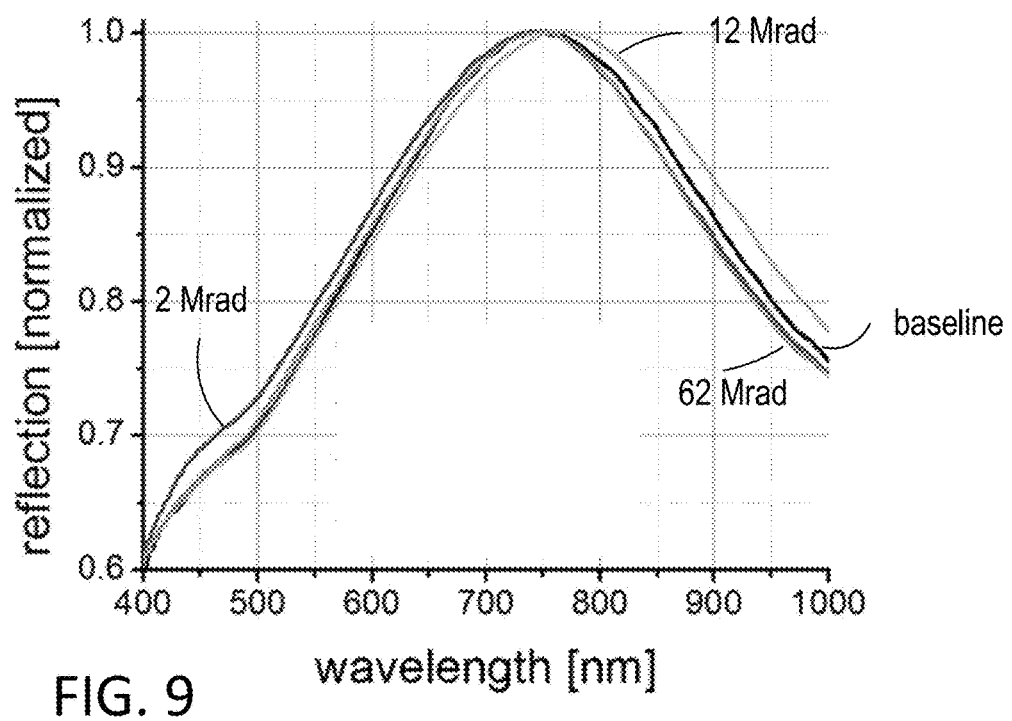
FIG. 9
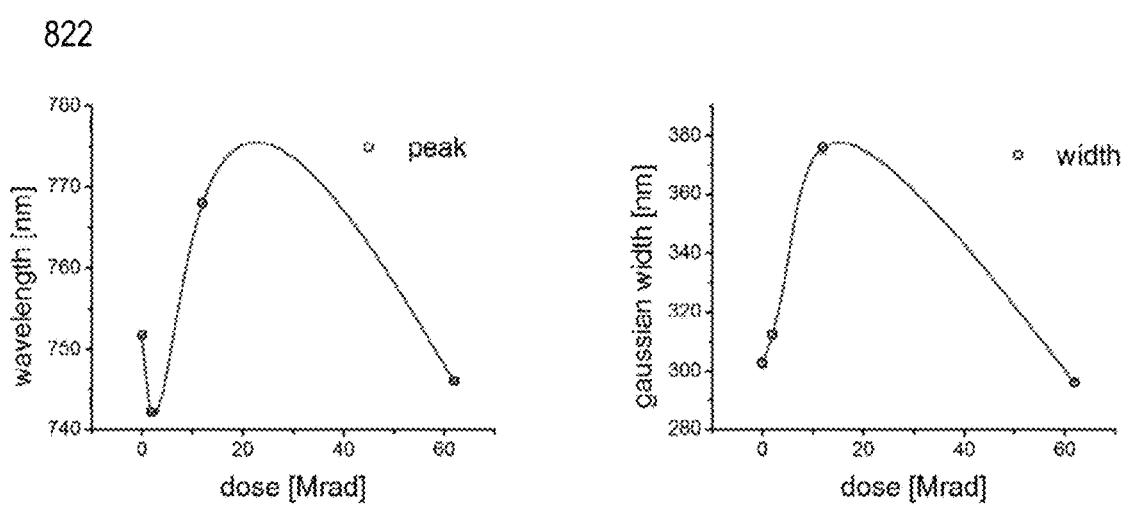
FIG. 10A
FIG. 10B

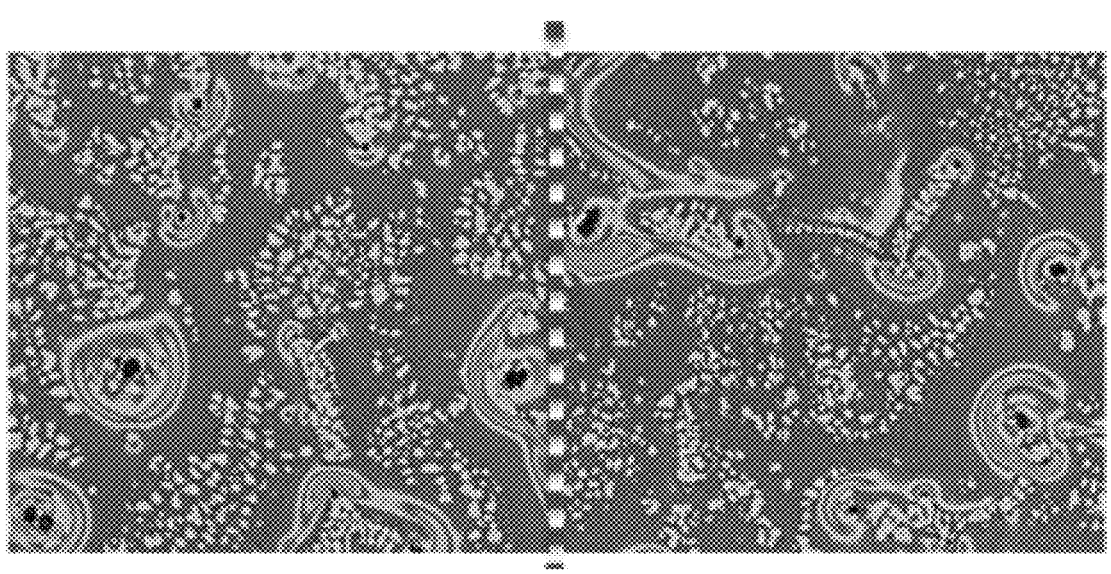
FIG. 15A                    FIG. 15B
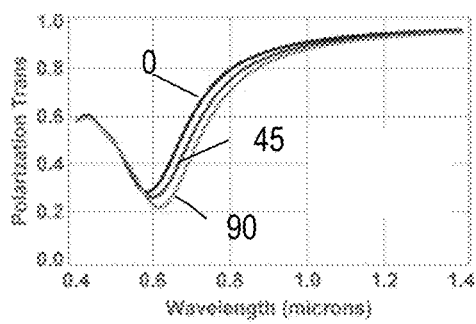 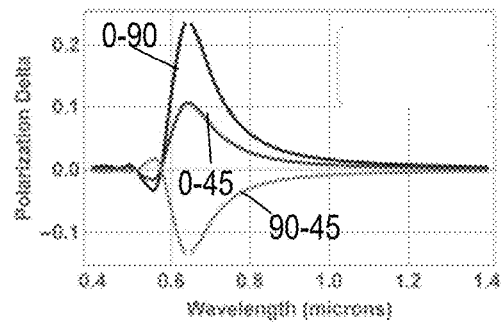
FIG. 16A                    FIG. 16B

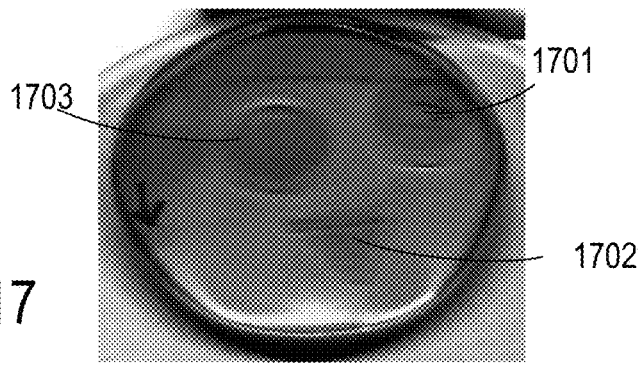
FIG. 17
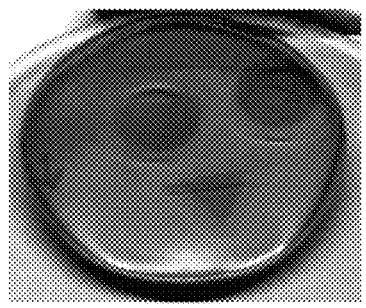 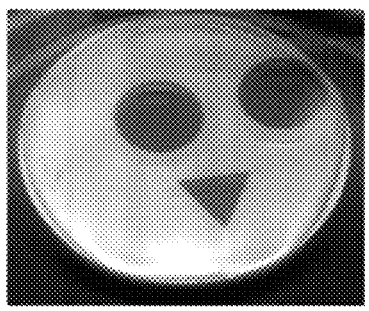 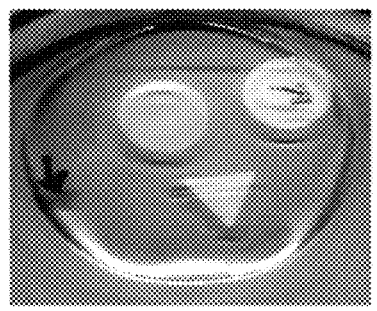
FIG. 18A  FIG. 18B  FIG. 18C

GAMMA RADIATION STAND-OFF DETECTION, TAMPER DETECTION, AND AUTHENTICATION VIA RESONANT META-MATERIAL STRUCTURES

CROSS REFERENCE TO RELATED APPLICATIONS

This application is a continuation in part of U.S. application Ser. No. 14/815,011, filed Jul. 31, 2015, which claims the benefit of U.S. Provisional Patent Application No. 62/032,400, filed Aug. 1, 2014, and is also a continuation in part of U.S. application Ser. No. 13/923,205, filed Jun. 20, 2013, which claims the benefit of U.S. Provisional Patent Application No. 61/662,275, filed Jun. 20, 2012, all of which are incorporated by reference herein.

ACKNOWLEDGMENT OF GOVERNMENT SUPPORT

This invention was made with Government support under Contract DE-AC05-76RL01830 awarded by the United States Department of Energy. The Government has certain rights in the invention.

FIELD

The present invention relates generally to coatings and methods of making and using subwavelength coatings and other subwavelength structures.

BACKGROUND

Conventional approaches to radiation dosimetry are often slow, expensive, or unnecessarily complex. The remote sensing of ionizing radiation dose without exposing detection electronics to ionizing radiation can be challenging, and dose readout often requires physical access to an ionizing radiation sensor. Tamper detection and device authentication continue to be important problems in many applications. Conventional approaches tend to be expensive and complex, are too easily defeated, and often unintentionally provide tamper warnings to unauthorized individuals. The present disclosure describes some practical solutions to such problems based on subwavelength materials as discussed below.

SUMMARY

Apparatus comprise an ionizing-radiation-sensitive optical nanostructure and an optical radiation source that delivers an interrogating optical beam to the optically responsive nanostructure. An optical receiver is situated to receive at least a portion of the optical beam from the optical nanostructure and provide an estimate of an ionizing-radiation dose based on the received portion. In some examples, the optical receiver is coupled to a display device that displays the estimated ionizing-radiation dose. In further examples, the ionizing-radiation-sensitive optical nanostructure comprises a plurality of oriented nanoshells or a nanomesh. In a particular example, the ionizing-radiation-sensitive optical nanostructure further comprises an ionizing-radiation-sensitive layer in contact with the plurality of oriented nanoshells and in some examples, the plurality of oriented nanoshells is situated in the ionizing-radiation-sensitive layer. In other examples, the plurality of nanoshells is ionizing-radiation sensitive or the nanoshells include at least one ionizing-radiation-sensitive shell layer.

In additional representative examples, the optical interrogation beam includes optical radiation at a plurality of wavelengths and the optical receiver provides the estimate of the ionizing-radiation dose based on received optical radiation as a function of wavelength. In some examples, the optical interrogation beam includes optical radiation at a plurality of wavelengths and the optical receiver is situated to receive reflected optical radiation from the ionizing-radiation-sensitive nanostructure and provide the estimate of the ionizing-radiation dose based on a reflectance or transmission change as a function of wavelength. In still other examples, the optical interrogation beam is configured to produce optical beam portions having at least two different states of polarization, and the optical receiver provides the estimate of the ionizing-radiation dose based on received optical radiation as a function of the at least two different states of polarization.

In some examples, the ionizing-radiation-sensitive nanostructure includes a nanomesh such as a metallic or dielectric nanomesh. In representative examples, the ionizing-radiation-sensitive nanostructure includes an ionizing-radiation-sensitive layer in contact with the nanomesh, and the ionizing-radiation-sensitive layer is a polymer layer or a metal oxide layer. In other alternatives, the ionizing-radiation-sensitive nanostructure includes an ionizing-radiation-sensitive material in voids in the nanomesh.

Methods comprise directing an optical beam to at least one nanostructure, receiving a portion of the optical radiation from the nanostructure, and determining an ionizing-radiation dose based on the received portion. In typical examples, the nanostructure is a nanomesh or a plurality of nano shells.

Tamper-indicating films comprise a nanostructure and a substrate coupled to the nanostructure, wherein the substrate is stressed so as to dimensionally change in response to a mechanical disturbance. In typical examples, the nanostructure is a nanomesh or a plurality of nanoshells. In some examples, the nanostructure defines an irregular nanostructure pattern. In further embodiments, the nanostructure is defined by a plurality of irregularly situated templates. According to one example, a sealing layer is situated to contain the nanostructure. In still further examples, an encapsulating layer is situated so that the nanostructure is at least partially encapsulated by the encapsulating layer. In a particular example, the nanostructure includes silver and encapsulated sulfur in the encapsulating layer.

Methods comprise applying at least one tag that includes a nanostructure to an object. Optical radiation reflected, transmitted, or scattered from the nanostructure is measured at a plurality of wavelengths or polarizations, and based on the received optical radiation, it is determined if the object has been tampered with. In other examples, the at least one tag is applied so as to match a visual appearance of at least one surface area of the object and at least partially conceal the presence of the at least one tag. In still further examples, it is determined if the object has been tampered with, based on oxidation of at least a portion of the nanostructure. In typical examples, the nanostructure is a plurality of nanoshells or a nanomesh. In some cases, the object is determined to have been tampered with without apparent visual change of the applied tag. In still further examples, the received optical radiation is detected at a plurality of wavelengths, and tampering is detected based on a principal component analysis of the optical power of the received optical radiation at the plurality of wavelengths.

BRIEF DESCRIPTION OF THE DRAWINGS

FIGS. 1A-1B illustrate a representative subwavelength structure based on close-packed spherical templates.

FIGS. 2A-2B illustrate a representative subwavelength structure based on spherical templates that define conductive shells.

FIG. 3A illustrates a representative subwavelength structure based on spherical templates of two different diameters.

FIG. 3B illustrates another representative subwavelength structure based on close-packed spherical templates.

FIGS. 3C-3D illustrates a representative subwavelength structure based on close-packed spherical templates with nanoparticles situated in or at voids between the spherical templates, typically produced by wet deposition.

FIG. 8 illustrates a representative remote ionizing-radiation detector based on a nanoplasmonic film. Film resonance wavelength shifts due to increased ionizing-radiation dose can be detected with remote active or passive interrogation, without power sources or ionizing-radiation-sensitive electronics at the sensor location.

FIG. 9 illustrates shifts in a reflectance peak as a function wavelength for three different exposures of a PMMA nanoshell ionizing-radiation sensor to gamma radiation along with a baseline measurement.

FIGS. 10A-10B are plots of wavelength shift of the peak of the reflectance of the film versus ionizing-radiation dose (FIG. 10A) and a Gaussian width of the response (FIG. 10B). The PMMA nanoshell system behaves non-monotonically due to exposure to gamma irradiation. After an initial decrease in resonance peak wavelength, a linear shift in wavelength resonance peak occurs in the regime from 2-12 Mrad. In the regime from 12 Mrad to 62 Mrad, the resonance wavelength peak once again decreases due to the complex behavior of PMMA to gamma irradiation.

FIGS. 15A-15B illustrates wetting defects in a nanoplasmonic template film.

FIGS. 16A-16B illustrate representative polarization dependences of subwavelength nanostructures.

FIG. 17 illustrates an object having nanostructure-tagged regions.

FIGS. 18A-18C illustrate images of the object of FIG. 17 based on three largest principal components obtained by principal component analysis of a hyperspectral image.

DETAILED DESCRIPTION

Figure 4:
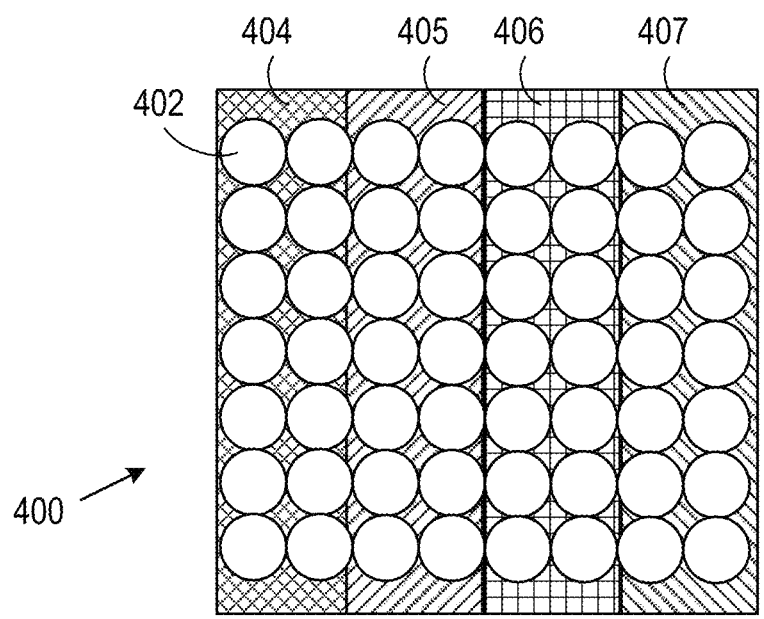
FIG. 4 illustrates a representative subwavelength structure based on spherical templates that are coupled to different ionizing-radiation-sensing layers.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest," "best," "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

The disclosure pertains to methods of forming subwavelength coatings or structures with desired electromagnetic scattering in the infrared, UV, or visible. Subwavelength coatings can incorporate subwavelength objects of various sizes. The term "subwavelength" used herein means objects in the coating have dimensions less than a wavelength of electromagnetic radiation reflected or redirected by the coating. For example, a subwavelength structure that is subwavelength to visible light (about 400 nm to 700 nm) would include objects having dimensions at or below about 300 nm. The term "coating" encompasses both films and coatings. The term "nanostructure" encompasses nanoscale objects including, e.g., nano spheres, nanorods, and nanoparticles having a dimension less than about 500 nanometers (nm), or less than about 200 nm, or less than about 100 nm, or less than about 50 nm, or less than about 20 nm. Nanostructures can be substantially homogeneous in material properties. However, in other embodiments, the nanostructures can be heterogeneous. Nanostructures can be substantially crystalline (monocrystalline or polycrystalline), amorphous, or include both crystalline and amorphous properties. The term "microstructure" encompasses microscale objects including, e.g., spheres, rods and particles having a dimension less than about 30 microns.

The terms "deposit" and "deposition" used herein may mean to emplace, to introduce, or to place. In some embodiments, "wet deposition" is described herein in which nanostructures or microstructures are deposited directly to substrates in solvents or aqueous solutions without need for vacuum-processing techniques such as, for example, vacuum-lithography (e.g., e-beam or ion beam) or vacuum-deposition, although such processes can be used in other examples.

As used herein, optical radiation or optical beams refers to propagating electromagnetic radiation at wavelengths between 100 nm and 10 μm, including visible, IR and near IR wavelength bands. Applications of the subwavelength structures disclosed herein are typically based on interactions of such optical radiation with the subwavelength structures. As used herein, the expression "ionizing radiation" refers to electromagnetic radiation at wavelengths less than about 10 nm, including extreme ultraviolet, soft and hard x-ray, and gamma rays bands as well as charged particle radiation such as ion beams, electron beams, or proton beams. In some applications, subwavelength structures are arranged for detection of ionizing radiation dose based on interaction with one or more optical beams. In some disclosed examples, optical beams are directed to one or more subwavelength structures to detect changes associated with ionizing radiation exposure, tampering, or to detect other aspects of the subwavelength structures. Such beams can be referred to as interrogating or interrogation beams for convenience.

As used herein, subwavelength spheres have a diameter less than or equal to about two thirds of a wavelength in the UV, IR, or visible spectrum of interest. For example, for a coating designed to operate in the visible spectrum at 500 nm, subwavelength spheres would be no larger than about 333 nm in diameter. For a coating designed to operate in the IR spectrum at 8 μm, subwavelength spheres would be no larger than about 5.3 μm in diameter. The term "self-assemble" means the nanoscale or micron-scale spheres arrange themselves in a quasi-organized structure or pattern on the substrate. The term "template" refers to a base layer or scaffold comprised of nanospheres or microspheres in a close-packing arrangement or near close-packing arrangement on the substrate. The term "close-packing" means the nanospheres or microspheres are arranged in a layer or layers on the substrate in which the nearest neighbor particles are either touching or nearly touching.

The template or scaffold formed by the particles or spheres of a first material may include subwavelength-sized voids or depressions ("valleys") positioned between the spheres into which a second material is deposited or filled. The substrate containing first and second materials in the selected arrangement may be heated at a preselected temperature to dry or sinter the structure that yields the final subwavelength coating. In such examples, vacuum deposition is not required. As described above, the dielectric spheres of the first material may include an average size (diameter) smaller than about two-thirds of a selected wavelength within the UV, visible, or infrared part of the electromagnetic spectrum.

In some embodiments, dielectric spheres serve as templates and may include a ceramic material, a polymer material, or a metal oxide. Polymer materials may include, but are not limited to, for example, polystyrene, poly-methyl methacrylate, or cross-linked poly(styrene/divinylbenzene) (P[S/DVB]), melamine, polyactide, or combinations thereof. Ceramic materials may include, but are not limited to, for example, silica, alumina, titania, or combinations of these materials. Dielectrics may also include metal oxides with a metal-insulator transition such as vanadium oxide.

Interactions of subwavelength structures with optical beams can produce changes in beam angle of propagation, reflected, scattered, or transmitted intensity, phase, or state of polarization as a function of wavelength. Subwavelength resonant structures that are at least partially made of ionizing-radiation-sensitive materials can exhibit ionizing-radiation induced changes that are detected in order to determine ionizing-radiation exposures. In some cases, additional materials are provided by coating or processes so as to be situated proximate to subwavelength structures so as to alter structure resonance and associated optical properties. Templates used to form such structures can be ionizing-radiation sensitive as well. Representative ionizing-radiation sensitive materials include metal oxides such as NiO, ZnO, $SnO_2$, $WO_3$, $MoO_3$, $SiO_2$, $LaFO_3$, $CeO_2$, $TeO_2$, $In_2O$, SiO, MnO, crystalline materials such as silicon and germanium, any materials that exhibit color centers, polymers, particularly aliphatic polymers and/or those that exhibit oxidation effects such as low molecular weight polyaniline, poly acid acrylic composites, polypropylene, polytetrafluoroethylene, polyacetals, or metal phthalocyanines, including CuPc, NiPc, MnPc, and CoPc. In some cases, such ionizing-radiation sensitive materials are mixed with a binder or other material.

Disclosed herein are representative examples of optical resonant structures (also referred to herein as "subwavelength structures") that incorporate one or more ionizing-radiation sensing materials so as to permit sensitive detection of ionizing-radiation induced changes. In typical examples, so-called subwavelength structures are used in which substructure dimensions are less than a wavelength associated with the optical radiation for which the structures are to be used. Typical dimension are less than 0.67, 0.5, 0.4, 0.3, 0.25, or 0.1 times a selected wavelength. For example, for optical resonant structures based on subwavelength spheres for use at 500 nm, sphere diameters are selected to be less than 333 nm; for use in the infrared at a wavelength of 8 µm, sphere diameters are selected to be less than about 5.3 µm. Nanostructure feature sizes range from 1, 10, 20, 50, 100, or 200 nm to 1000, 800, 700, 600, 500, or 400 nm respectively. In some cases, features sizes are less than 10, 20, 50, 80, 100, or 200 nm.

In some examples, the term "template" refers to a base layer or other structure or structures that serve to support or define additional materials or layers situated on the template. For example, nanospheres or microspheres can be situated on a substrate to serve as a templates, and additional materials or layers situated on or around the nanospheres or microspheres. In some cases, a template is defined as part of a substrate. In some cases, such a template or template layer is removed to form a subwavelength structure. For example, nanospheres can be used as a template and then removed by etching or with a solvent, depending on nanosphere composition. If discrete templates such as nanospheres or nanorods serve as templates, such templates can be close-packed so as to contact or nearly contact adjacent templates, or the templates can be widely spaced, or can be spaced so as to be situated within shadow regions defined by adjacent templates. Templates can be arranged randomly or periodically on a substrate. In other examples, periodic or aperiodic template surfaces are defined in a substrate or in one or more layers on the substrate. As used herein, the term "close-packing" refers to templates arranged in a layer or layers on a substrate so that nearest neighbor particles are in contact or nearly in contact. For a template having a minimum dimension D, "close-packed" refer to arrangements of templates situated so that nearest neighbors are within about 1D, 0.5D, 0.25D, 0.10D, or 0.05D of each other. Other arrangements can be referred to as non-close-packed.

In some examples, templates are arranged so that subwavelength-sized voids or depressions ("valleys") are positioned between the templates into which a second material can be deposited so as to fill or partially fill the voids. A substrate having such filled voids can be heated at a preselected temperature to dry or sinter so as to produce a final subwavelength coating or structure. Subwavelength coatings can include a quasi-periodic subwavelength mesh structures or coatings of the second material that extends in at least two dimensions substantially conformal to the substrate. In typical examples, the mesh structure or coating of the second material may include a dielectric or a metal, Dielectric spheres or other templates may include a ceramic material, a polymer material, or a metal oxide. Polymer materials may include, but are not limited to, for example, polystyrene, poly-methyl methacrylate, or cross-linked poly (styrene/divinylbenzene) (P[S/DVB]), melamine, polyactide, or combinations thereof. Ceramic materials may include, but are not limited to, for example, silica, alumina, titania, or combinations of these materials. Dielectrics may also include metal oxides with a metal-insulator transition such as vanadium oxide. Such materials can be functionalized with ligands or combined with a surfactant for enhanced dispersion in a solvent or aqueous solution for deposition.

Substrates on which templates are situated can be flexible or rigid. Substrates suitable for use include, but are not limited to, for example, metals, metal alloys, metal oxides, silicon oxides, glass, glass-containing materials, low-E glass, ceramics, silicon carbide (SiC), polyimides (e.g., KAPTON), polyamides (e.g., NYLON), polymers, polyesters, plastics, and combinations of these materials. In various embodiments, substrate metals may include, for example, aluminum, copper, and iron or alloys such as alloys of steel, copper, aluminum, iron, and combinations of these various metals and metal alloys. Glass-containing materials includes fused silica glasses, borosilicate glasses, and other glasses. Ceramics may include, but are not limited to, e.g., alumina, titania, sapphire, yttria, yttrium-stabilized zirconium (YSZ), silicon carbide (SiC), and combinations thereof. Polymers may include, but are not limited to, e.g., acrylics, polyesters, polystyrenes, polyethylenes, polycarbonates, and combinations thereof.

Example 1

With reference to FIGS. 1A-1B, a representative film 100 includes a plurality of templates 102 situated on a surface of a substrate 104. In this example, the templates 102 are nanospheres having common diameter and composition, and arranged in a rectangular array, close-packed so as to be in contact. In some examples, an additional material such as a fill layer 106 is situated so as to fill or partially fill voids surrounding one or more of the templates 102. In other examples, the templates are arranged in other patterns or are arranged irregularly, and can be in contact or spaced apart. The voids can be filled or partially filled with various materials and combinations of materials such as metal oxides, metals, polymers, dielectrics or other materials. Some materials can be provided as nanoparticles while other are deposited by evaporation, sputtering, spray coating or other processes. Such materials can be situated on the templates in addition to being in the voids. Typical nanosphere diameters are between 40 nm and 80 nm, between 20 nm and 100 nm, or between 20 nm and 300 nm, or other ranges.

Some or all of the components of the film 100 can be selected so that one or more optical resonances of the film 100 varies in response to incident ionizing radiation such as gamma radiation, x-radiation, or ionized particle radiation. For example, the templates 102 can be made of an ionizing radiation-sensitive material. Alternatively, the fill material 106 or the substrate 104 can be an ionizing-radiation-sensitive material. Detection of ionizing radiation exposure can be based on shift in a resonance peak of a resonant structure, a spectral bandwidth, a magnitude of reflected or transmitted optical radiation, other interaction of optical radiation with the film 100.

As shown in FIGS. 1A-1B, a film is formed on a planar substrate or a substrate that can be made planar; in other examples, subwavelength structures are formed on or have other shapes such as curved, bent, angled or other shapes such as spherical, polygonal, or ellipsoidal. In some examples discussed below, films that include subwavelength structures are conformal with a product, package, sign, or other object so that any disturbance of the film indicates access to or tampering with the object.

Example 2

FIGS. 2A-2B illustrate another representative film 200 that includes subwavelength structures based on caps 206 applied to spherical templates 202. The templates 202 are situated on a substrate 204, and the caps can be single or multilayer coatings of metallic, dielectric, or other materials. In this example, the caps 206 are generally centered about axes perpendicular to a surface 205 of the substrate 204. The placement and orientation of the caps 206 can be controlled by, for example, sputtering at a selected angle with the templates 202 situated to block deposition on adjacent templates 202 by shadowing.

Example 3

FIG. 3A illustrates another representative film 300 that includes subwavelength structures based on templates 302 of a first radius and templates 303 of a second radius. The templates 302, 303 are situated in, on, or are at least partially covered by an ionizing-radiation-sensitive layer 306 or a binding or a layer for another purpose. The templates 302, 303 are shown as arranged in alternative rows, but can be arranged randomly, or in some other periodic or non-periodic arrangement. Additional templates of additional sizes and/or shapes can be used. If desired, portions of selected or all templates can be coated. FIG. 3B illustrates an alternative arrangement of template nanospheres.

FIGS. 3C-3D illustrate a coated substrate 362 upon which nanoparticles 366 have been deposited. The nanoparticles 366 are typically of a different material than that of templates 364 and are situated to fill or partially fill voids and valleys positioned between the templates 364. Silver or gold nanoparticles are convenient.

Example 4

FIG. 4 illustrates another representative film 400 that includes subwavelength structures based on templates 402 that are situated in, on, or are at least partially covered by ionizing-radiation-sensitive layers 404, 405, 406, 407 (or binding or other layers). The ionizing-radiation-sensitive layers 404, 405, 406, 407 can be of different materials or thicknesses so as to provide ionizing-radiation sensitivity to one or more types of ionizing radiation.

Example 5

Figure 5:
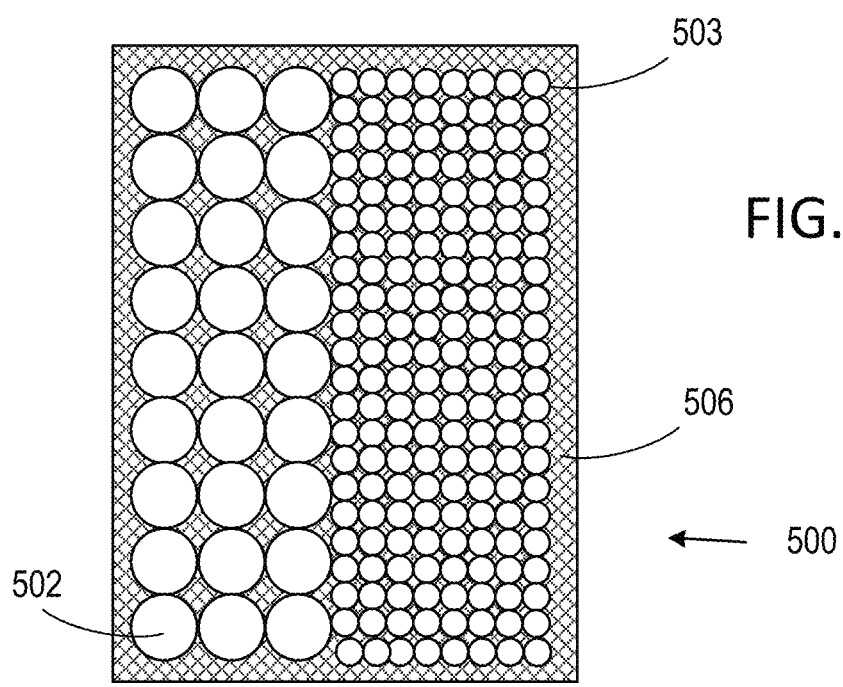
FIG. 5 illustrates a representative subwavelength structure based on spherical templates of two different diameters that are coupled to different ionizing-radiation-sensing layers.

FIG. 5 illustrates another representative film 500 that includes subwavelength structures based on templates 502, 503 that are situated in, on, or are at least partially covered by a layer 506 which can serve as a binding layer, a protective layer, an ionizing-radiation-sensing layer or a layer serving some other function.

Example 6

Figure 6A:
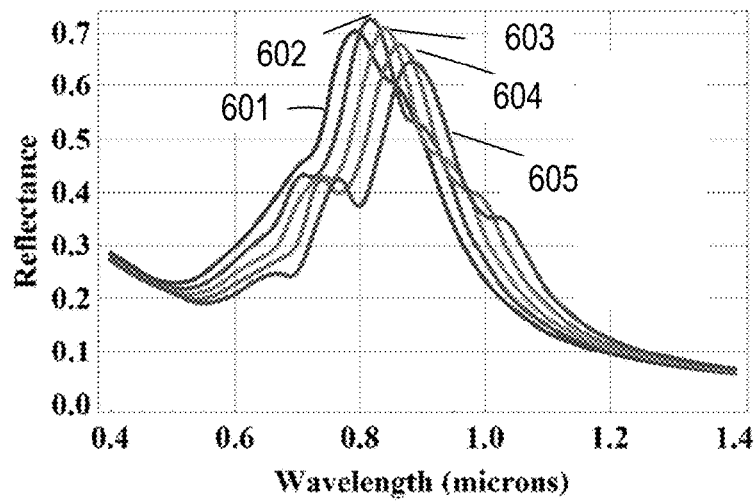
FIG. 6A is a graph of modeled transmission in the near field of a nanoshell plasmonic film constructed of 110 nm diameter poly (methyl methacrylate) (PMMA) nanospheres coated with 15 nm of sputtered gold, deposited at a sputtering angle of 45°. In each trace, the index of refraction of the PMMA is increased by 0.1 to demonstrate the behavior of the plasmonic film as the index is changed due to ionizing radiation damage.
Figure 6B:
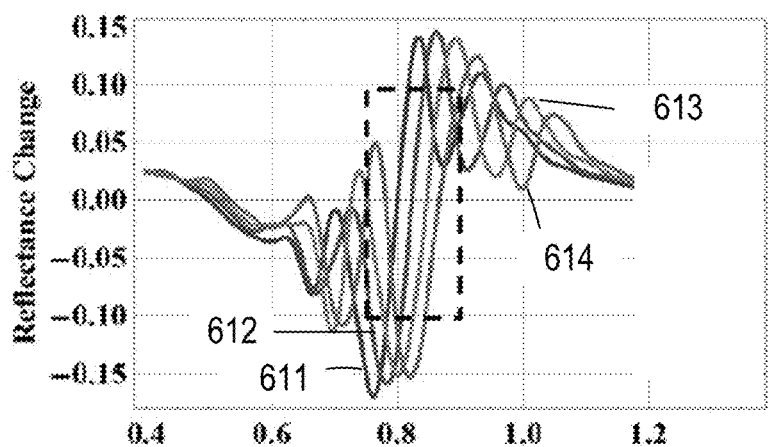
FIGS. 6B-6C are graphs of reflection change per unit wavelength corresponding to the transmission graph of FIG. 6A. A highlighted window (dashed box) of FIG. 6B is shown in FIG. 6C demonstrating resonance shifts of zero crossing wavelength of approximately 20 nm for a 0.1 change in refractive index.
Figure 6C:
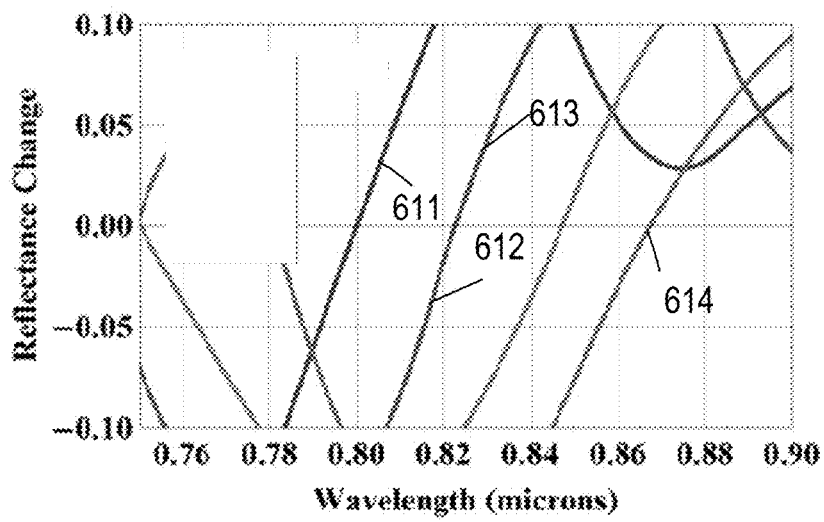

FIG. 6A-6C illustrate calculated changes in reflectance as a function of wavelength for a nanoshell plasmonic film constructed of 110 nm diameter poly (methyl methacrylate) (PMMA) nanospheres coated with 15 nm of sputtered gold, deposited at a sputtering angle of 45°. In FIG. 6A, curves 601-605 are reflectances associated with a series of 0.1 changes in PMMA refractive index. FIGS. 6B-6C are graphs of reflectance change per unit wavelength (611-614) corresponding to the graphs (601-604) of FIG. 6A. A highlighted window (dashed box) of FIG. 6B is shown in FIG. 6C demonstrating resonance shifts of zero crossing wavelength of in approximately 20 nm for a 0.1 change in refractive index.

Example 7

Figure 7A:
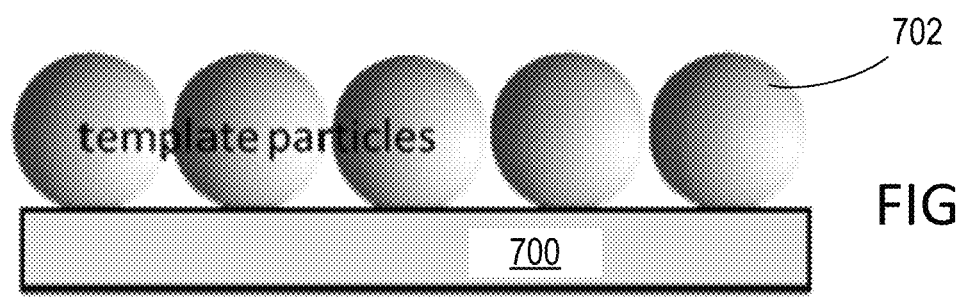
FIGS. 7A-7C illustrate a representative fabrication procedure for forming an optically resonant sensor using PMMA spheres.
Figure 7B:
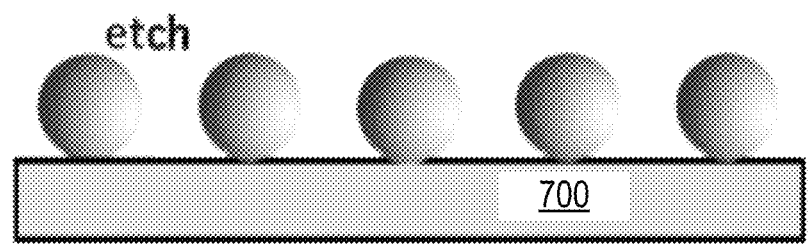
Figure 7C:
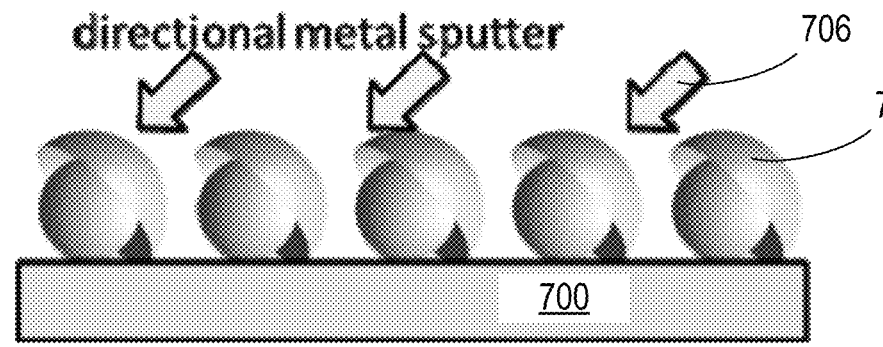

A representative method of fabricating nanostructures is illustrated in FIGS. 7A-7C. A plurality of templates 702 is situated on a substrate 700 so as to be close-packed or spaced apart. As shown in FIG. 7B, the templates 702 are etched to decrease template dimensions and a coating such as a metallic coating 704 is applied to the etched templates 702 from a direction 706 by sputtering or other directional deposition process. A highlighted window (dashed box) of FIG. 6B is shown in FIG. 6C demonstrating resonance shifts of zero crossings found by taking the derivative of the reflectance change per unit wavelength (611-614) in FIG. 6A of approximately 20 nm for a 0.1 change in refractive index.

Example 8

Referring to FIG. 8, a representative ionizing radiation detection system 800 includes an optical source 802 that directs an optical beam along an axis 803 though beam forming optics 804 to an ionizing-radiation sensor 808 that includes subwavelength structures as illustrated above. The ionizing-radiation sensor 808 is situated to receive ionizing radiation from an ionizing-radiation source 809. Portions of the incident optical beam are directed as an output optical beam along an axis 810 to collection optics 812 and to an optical receiver 820. As shown in FIG. 8, input and output beams propagate along axes that are at different angles $\phi 1$, $\phi 2$ with respect to a surface normal 814, but other arrangements can be used. In some examples, the optical source provides a narrow band, broadband, or swept frequency optical beam and the optical receiver detects optical power as a function of wavelength. In some example, a spectral reflectance minima or maxima, a spectral width, a change in reflectance as function of wavelength, or other characteristic of the optical radiation received from the ionizing radiation sensor 808 is used. The optical beam can be scanned so as to assess ionizing radiation at multiple locations on a single ionizing-radiation sensor or multiple sensors, or multiple sensor areas can be exposed to the optical beam simultaneously. Typically, a processor and display 822 are coupled to at least the optical receiver so as to determine ionizing-radiation dose based on spectral characteristics such as shown in FIGS. 6A-6C. In some cases, the optical receiver 800 is or includes a spectral imager so that spectral characteristics of an area of an ionizing-radiation-sensitive film can be assessed.

Representative optical responses are shown in FIGS. 9 and 10A-10B for exposures of a PMMA nanoshell ionizing-radiation sensor to gamma radiation. Both peak wavelength and spectral bandwidth (Gaussian) vary with ionizing-radiation dose; in some cases, response is non-monotonic.

Example 9

Figure 11:
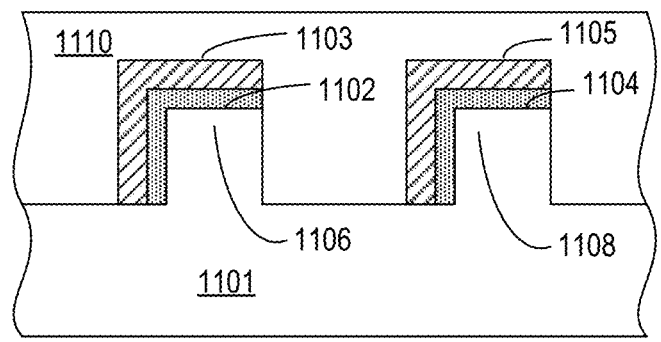
FIG. 11 illustrates a nano shells formed on periodic rectangular ridges to which an ionizing-radiation-sensitive layer is applied.

In yet another example shown in FIG. 11, nanoshells 1102, 1104 are situated on respective rectangular protrusions 1106, 1108 in a substrate 1101. Ionizing-radiation-sensitive layers 1103, 1105 are situated on the nanoshells 1102, 1104, respectively. In other examples, ionizing-radiation-sensitive layers or other arrangements of ionizing-radiation-sensitive materials can be situated within the templates, around the templates, on top of or underneath the templates (such as on the substrate 1101), or a combination of the above. The protrusions 1106, 1108 typically have widths and heights ranging from about 10 nm to about 500 nm, and can be capped with an index matching layer 1110. The protrusions 1106, 1108 can be rectangular bumps or can extend along a line or curve and have an associated rectangular cross-section. In other examples, depressions or cavities are formed in a substrate, and cavity walls used to define nanoshells.

Example 10

Subwavelength films and other subwavelength structures are particularly well suited to applications in tags and seals. They have a unique optical reflection that is wavelength, angle, and polarization dependent and can be tailored to operate from the visible to the infrared region to generate visibly transparent films. Due to their subwavelength dimensions, their features cannot be resolved for reverse engineering using optical imaging methods and are generally difficult to counterfeit. They can also be integrated with design or architectural features to camouflage their use. Their unique optical signature is dependent on the geometry and fabrication process of the nanostructures in the film, rather than on the bulk properties of the construction material used. In addition, the nature of the film deposition generates a totally random and unique fingerprint within the film. Oxidation and strain sensitive matrix materials can make tampering and counterfeiting of these films readily detectable. Readout can be relatively simple using a combination of broadband optical illumination and a dispersive optical detector.

Figure 12:
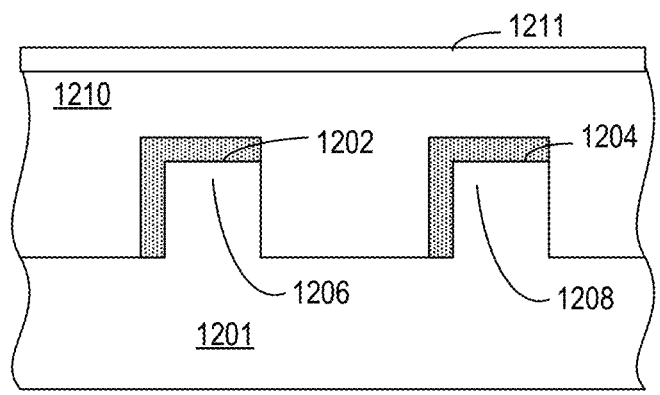
FIG. 12 illustrates a nanoshells formed on periodic rectangular ridges which are contained by a sealing layer to inhibit interaction of the nanoshells and atmospheric constituents.

With reference to FIG. 12, a tamper-sensitive film includes nanoshells 1202, 1204 situated on respective rectangular protrusions 1206, 1208 in a substrate 1201. A cover layer 1211 is placed so as to define a sealed volume 1210 to which the nanoshells 1202, 1204 are exposed. In some examples, the sealed volume 1210 is filled with a gas such as nitrogen or a noble gas such as argon. The nanoshells 1202, 1204 are made of a reactive material such as a silver layer so that if the sealed volume 1210 is opened, one or more optical properties of the nanoshells are altered by exposure to normal atmospheric constituents. Typically, such alterations are visually apparent, but measurement apparatus can be used as well for alterations that visually concealed. The protrusions 1206, 1208 typically have widths and heights ranging from about 10 nm to about 500 nm. As noted above, the protrusions 1206, 1208 can be rectangular bumps or can extend along a line or curve and have an associated rectangular cross-section. In other examples, depressions or cavities are formed in a substrate, and cavity walls used to define nanoshells.

Example 11

Figure 13:
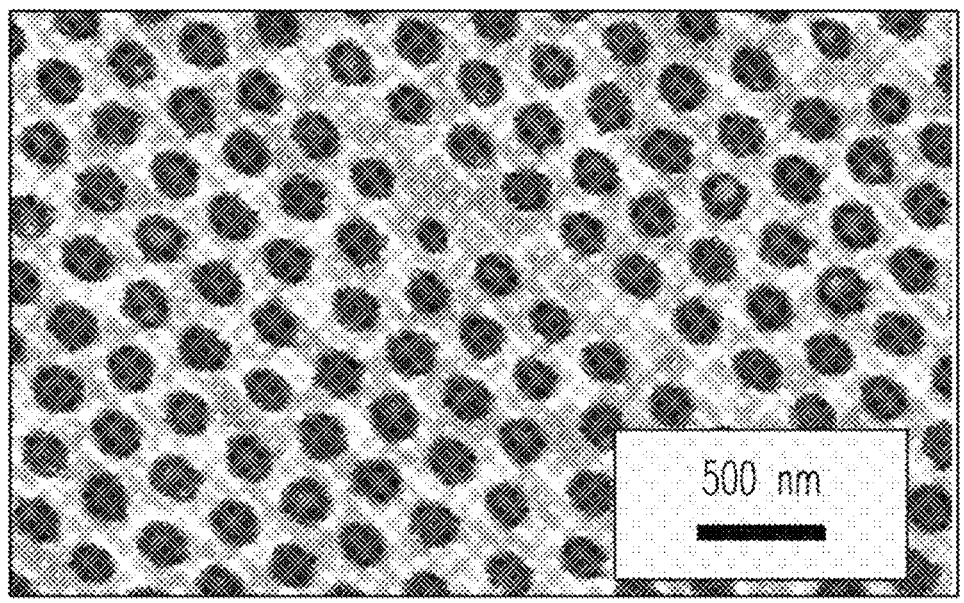
FIG. 13 is an SEM image showing a representative subwavelength mesh coating (a nanomesh) including a characteristic quasi-periodic pattern of subwavelength features.

FIG. 13 is an SEM image of a representative mesh coating formed by vacuum deposition of a selected material such as a metal onto polystyrene, silica, or other templates (with or without etching), followed by removal of the templates by etching or other processes. In this example, the templates are sacrificial and are largely absent from a final film.

Example 12

Figure 14A:
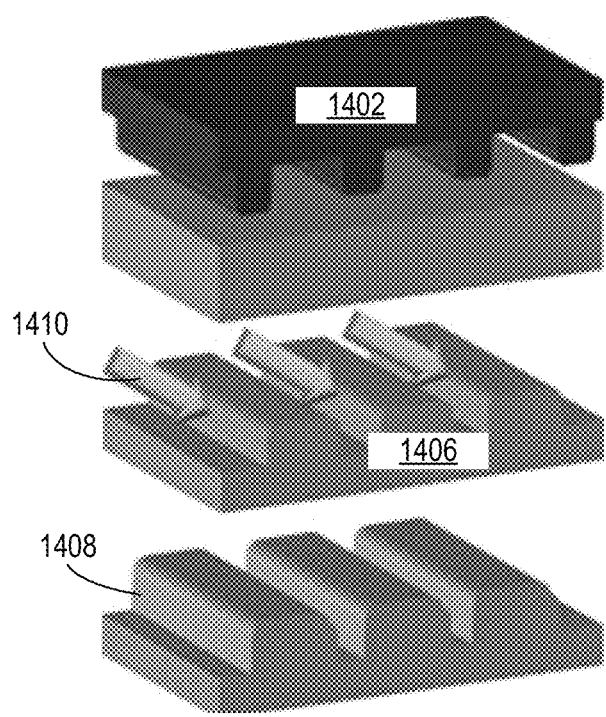
FIGS. 14A-14B illustrate a method of making subwavelength nanostructures.
Figure 14B:
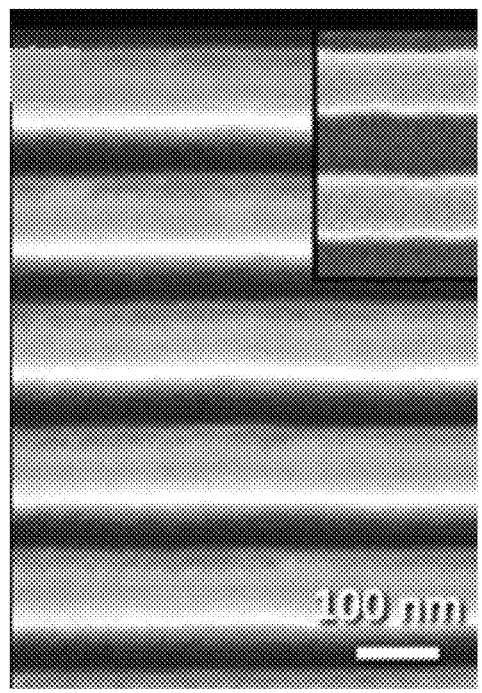

FIGS. 14A-14B illustrate an alternative fabrication process in which a master 1402 is used to emboss a pattern in a polymer layer 1404 which is then cured to form a patterned layer 1406. Metallic or other nanoshells 1408 are then formed by sputtering along a direction 1410.

Example 13

An example of the random and fractal nature of a wet deposition process and application to tamper resistance is shown in FIGS. 15A-15B. FIG. 15A illustrates a random defect pattern and FIG. 15B illustrates the random defect pattern of FIG. 15B after oxidation by exposure to air. In one example, a suitable process for forming such patterns includes forming a template layer (that may or may not be used as a sacrificial template) using, for example, dielectric nanospheres such as polystyrene or other selected polymers, silica, or metal oxides from a solution or suspension of such templates in an water or an organic solvent. Concentrations of templates can range from about 1% to about 20% by weight or other concentrations. Wet deposition can produce subwavelength structure variations that can be used as fingerprints for the detection of tampering or determinations of authenticity. A dielectric or metallic cap can be deposited onto the templates using directional deposition so as to shadow regions of the substrate. Methods such as magnetron-sputtering or thermal evaporation can be used to deposit a noble metal such as silver or gold, a thermochromic metal oxide such as vanadium oxide, or other material. To produce a complex fingerprint patterns, templates are generally situated in an irregular or random fashion.

In some embodiments, deposition does not proceed from the source to the sample along a straight line (i.e., "line of sight"). In some embodiments, "line-of-sight" deposition may be performed in which a deposition angle between about 30 degrees to about 90 degrees relative to the sample normal or sample surface may be selected, measured from the plane of the substrate. A structure of the deposited material is formed on the substrate that includes subwavelength-sized ellipsoidal or circular holes created by shadowing of the templates that depends in part on the selected angle of deposition. For example, deposition that proceeds normal to the sample surface forms approximately circular holes, while deposition at approximately 60 degrees from the surface normal forms ellipsoidal holes. The long axis is approximately aligned along the projection of the sputter angle onto the substrate. Such deposition results in structures with an anisotropic optical response that can vary with angle and polarization.

Example 14

FIG. 16A shows calculated differences in transmittance for a film having 80 nm diameter polystyrene spherical templates sputtered with 20 nm of silver at an angle of 30° with linear polarized optical beams with polarizations at 0°, 45°, and 90°. FIG. 16B shows transmittance for the linear polarization differences between the 0° and 90°, the 0° and 45°, and 90° and 45° states of polarization. Thus, subwavelength structures as disclosed herein can be interrogated based on state of polarization, and changes in state of polarization that may be undetectable to a user.

In the example of FIGS. 16A-16B, there is a transmission minimum at about 600 nm and would provide a strongly visible return so as to be apparent to a human observer. However, the resonance can be shifted to a wavelength beyond the range of human color vision by increasing the size of the template nanospheres.

Example 15

In an example shown in FIG. 17, a two-inch diameter sample was made using a subwavelength film and a polydimethylsiloxane (PDMS) substrate. The sample consists of a PDMS disk with cutout geometric shapes 1701-1703, which are replaced with nanoplasmonic film inserts. Since the nanoplasmonic film has a bluish cast, the PDMS substrate was dyed with blue food coloring to reduce the contrast between the cut-out portions and the substrate in order to at least partially camouflage the film cutouts.

The sample was imaged using a visible/near-infrared (VNIR) imaging spectrometer and analyzed; spectral data was acquired from 400 nm to 1000 nm. The sample was illuminated with a tungsten-halogen line illuminator at a 45° angle of incidence, so regions of high sample reflectance are manifested by reduced image intensity since greater amounts of light are reflected and scattered out of the aperture of the imaging lens. This means an intensity minimum at 640 nm is a reflectance maximum.

There are many approaches that can be used to detect differences between the PDMS substrate and the nano film cutouts. Principal component analysis (PCA) is illustrated with reference to FIGS. 18A-18C. The principal component associated with FIG. 18A is associated with a greatest variance in measured color image intensity, and corresponds to a greyscale image. The principal components associated with FIGS. 18B-18C distinguish the cut-out regions from the food colored PDMS substrate and a sample dish. The spatial features of the cut-outs can be readily observed, but this approach shows that unique identifiers can be provided to an object that are not easily detected using unsophisticated methods, but can be easily seen from a distance using white light illumination and a dispersive and perhaps polarization-sensitive imaging detector. In FIGS. 18A-18C, only three principal components are used, but more or fewer can be used as well.

Example 16

Figure 19A:
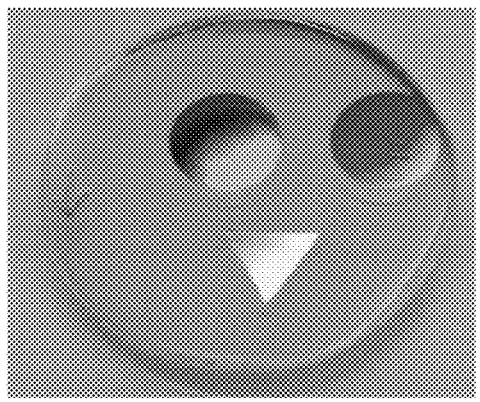
FIG. 19A is a gray scale rendering of RGB image formed from a difference between two hyperspectral images acquired at orthogonal polarization states, then operated on by the principal components, wherein components 2, 3, and 4 are mapped into red, green and blue display colors
Figure 19B:
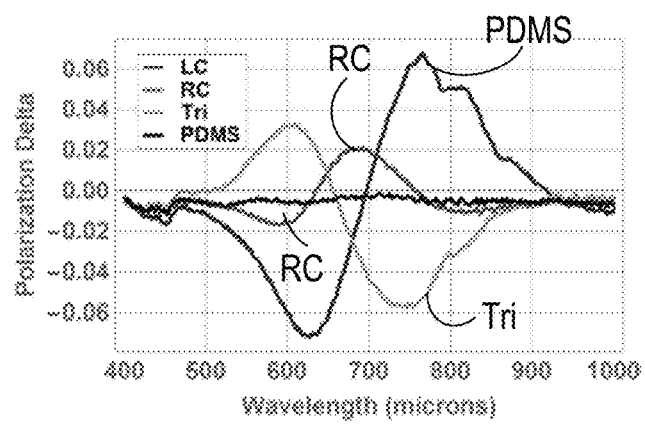
FIG. 19B is a graph of polarization difference as a function of wavelength for different tagged regions of FIG. 17.

Another example of the anisotropy of the nanoshells and their effect on the polarization of reflected and scattered light to further add uniqueness to a tag or a seal is shown in FIGS. 19A-19B. Two hyperspectral images were taken of the sample shown in FIG. 17 at orthogonal linear polarizations. The two images were then differenced and PCA was performed on the resulting hypercube and the first three principal components were mapped into display colors red, green, and blue, respectively. One can easily detect tampering by noting that all three cutouts are oriented randomly revealing that orientation along with spectral response could provide higher levels of security. Additionally, spectral plots were acquired through the center of each cut-out feature and are also provided in FIG. 19B showing distinctly different polarization difference profiles as a function of wavelength along with the insensitivity of the PDMS substrate to polarized light. Note the resemblance to the modeling results presented above for transmittance although the demonstration film was measured in reflection. This is a consequence of the 45° illumination used in the imaging spectrometer whereby the film's increased reflectance reduces the amount of detected light since it is reflected and scattered out of the camera's field-of-view. Such films can be secured to or otherwise provided to an object to permit authentication or to detect tampering. For example, optical radiation associated with interaction of an optical beam with a suitable subwavelength structure can be used to verify object authenticity.

Example 17

Figure 20:
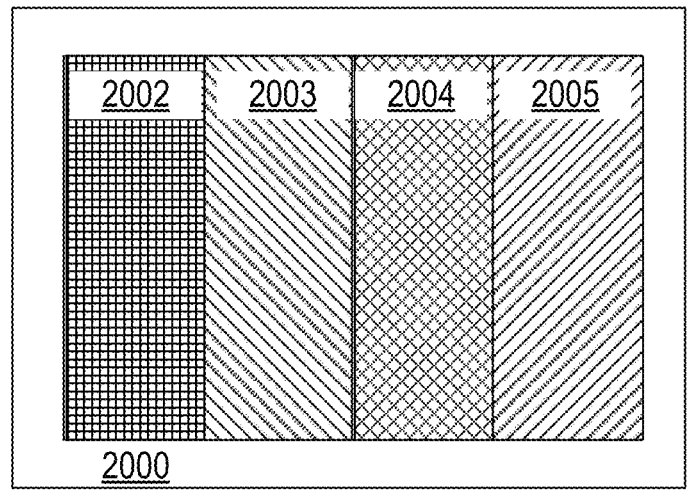
FIG. 20 illustrates a representative ionizing-radiation detection subwavelength resonant nanostructure film having a plurality of ionizing-radiation attenuating layers.

Referring to FIG. 20, an ionizing radiation detection film 2000 includes ionizing-radiation-attenuating layers 2002-2005 that can be different thicknesses of a common material or different materials. In one example, materials having different gamma radiation attenuations are used. The film 2000 includes subwavelength structures such as a nanomesh or nanoshells that can include one or more ionizing-radiation-sensitive materials and ionizing-radiation-hard materials, or combinations thereof.

Example 18

Figure 21:
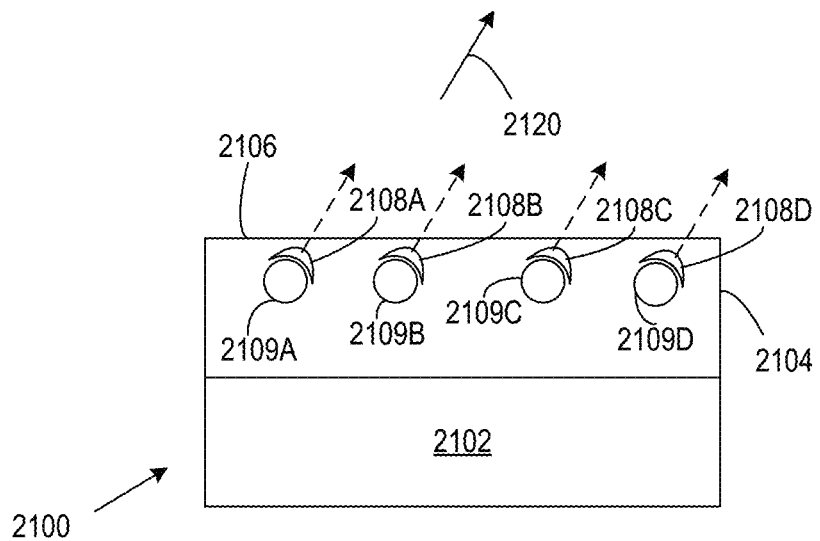
FIG. 21 illustrates an arrangement of nanoshells coupled to a stressed layer.

Referring to FIG. 21, a tamper detection film 2100 includes a first substrate 2102 and a second substrate 2104 that are bonded together. A plurality of oriented nanoshells 2108A-2108D situated on respective templates 2109A-2109D in or on the second substrate 2104 and are oriented with respect to an axis 2110. The second substrate 2102 is stressed, so that if disturbed, a surface 2106 of the second substrate 2104 is buckled, causing the nanoshell orientation to be lessened or eliminated. This reorientation can be detected to indicate tampering with the film 2100. In other examples, one or both of the substrates 2102, 2104 are stressed (and the substrate 2102 can be omitted). In another alternative, nanoshells can be arranged to align upon disturbance of the film instead of losing alignment. In some examples, nanoshells are formed of multiple layers of metals and metal oxides, such as alternating metal/oxide layers (for example, Au/ZnO).

Example 19

Figure 22:
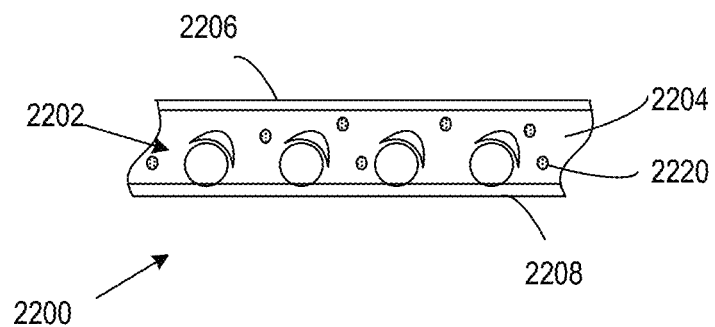
FIG. 22 illustrates a tamper-detecting film that includes an arrangement of nanoshells situated in an encapsulating layer that includes capsules of an oxidizing or other reagent that is released if the film is cut or torn.

Referring to FIG. 22, a tamper detection film 2200 includes a plurality of aligned nanoshells and templates 2202 situated on a substrate 2208. An encapsulating layer 2204 partially surrounds these nanostructures and is terminated by the substrate 2208 and a cap 2206. The encapsulating layer 2204 serves to shield the nanostructures from any environmental degradation, but includes capsules 2220 that contain a reagent suited to produce nanostructure degradation if ruptured by, for example, tearing or cutting. In one example, the nanostructures include silver and the capsules 2220 contain a sulfur compound chosen to react with silver.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim as our invention all that comes within the scope and spirit of the appended claims.

We claim:

1. An apparatus, comprising:
an ionizing-radiation-sensitive optical nanostructure;
an optical radiation source that delivers an optical interrogation beam to the optical nanostructure; and
an optical receiver that receives at least a portion of the optical interrogation beam from the optical nanostructure and provides an estimate of an ionizing-radiation dose based on the received portion;
wherein the optical interrogation beam includes optical radiation at a plurality of wavelengths and the optical receiver is situated to receive reflected, transmitted, or scattered optical radiation from the ionizing-radiation-sensitive nanostructure and provide the estimate of the ionizing-radiation dose based on a reflectance change as a function of wavelength.

2. The apparatus of claim 1, wherein the optical receiver is coupled to a display device that displays the estimated ionizing-radiation dose.

3. The apparatus of claim 1, wherein the ionizing-radiation-sensitive optical nanostructure comprises a plurality of oriented nanoshells.

4. The apparatus of claim 3, wherein the ionizing-radiation-sensitive optical nanostructure further comprises an ionizing-radiation-sensitive layer in contact with the plurality of oriented nanoshells.

5. The apparatus of claim 4, wherein the plurality of oriented nanoshells is situated in the ionizing-radiation-sensitive layer.

6. The apparatus of claim 3, wherein the plurality of nanoshells is ionizing-radiation sensitive.

7. The apparatus of claim 6, wherein the nanoshells include at least one ionizing-radiation-sensitive shell layer.

8. The apparatus of claim 1, wherein the ionizing-radiation-sensitive nanostructure includes a nanomesh.

9. The apparatus of claim 8, wherein the nanomesh is a metallic nanomesh.

10. The apparatus of claim 9, wherein the ionizing-radiation-sensitive nanostructure includes an ionizing-radiation-sensitive layer in contact with the nanomesh.

11. The apparatus of claim 10, wherein the ionizing-radiation-sensitive layer is a polymer layer or a metal oxide layer.

12. The apparatus of claim 9, wherein the ionizing-radiation-sensitive nanostructure includes an ionizing radiation-sensitive material in voids in the nanomesh.

13. The apparatus of claim 1, further comprising a tamper-indicating film, comprising:
the ionizing-radiation-sensitive optical nanostructure; and
a substrate coupled to the optical nanostructure, wherein the substrate is configured to dimensionally change in response to a mechanical disturbance and to change one or more optical properties of the optical nanostructure based on the dimensional change, wherein the change of the one or more optical properties provides a tamper indication that is detectable visually or with the optical interrogation beam.

14. The apparatus of claim 13, wherein the optical nanostructure is a nanomesh or a plurality of nanoshells.

15. The apparatus of claim 13, wherein the optical nanostructure defines an irregular nanostructure pattern.

16. The apparatus of claim 13, wherein the optical nanostructure is defined by a plurality of irregularly situated templates.

17. The apparatus of claim 13, further comprising a sealing layer that contains the optical nanostructure.

18. The apparatus of claim 13, further comprising an encapsulating layer so that the optical nanostructure is at least partially encapsulated by the encapsulating layer.

19. The apparatus of claim 18, wherein the optical nanostructure includes silver, and further comprises encapsulated sulfur in the encapsulating layer.

20. The apparatus of claim 13, wherein the optical nanostructure includes an ionizing-radiation-sensitive layer.

21. The apparatus of claim 13, wherein the change in one or more optical properties includes a reorientation of emission axes of the optical nanostructure.

22. The apparatus of claim 13, wherein the substrate includes a strain-sensitive layer that is configured to strain to record the dimensional change.

23. The apparatus of claim 1, wherein the optical receiver determines whether the nanostructure has been tampered with based on the received portion.

24. An apparatus, comprising:
an ionizing-radiation-sensitive optical nanostructure;
an optical radiation source that delivers an optical interrogation beam to the optical nanostructure; and
an optical receiver that receives at least a portion of the optical interrogation beam from the optical nanostructure and provides an estimate of an ionizing-radiation dose based on the received portion;
wherein the optical interrogation beam is configured to produce optical beam portions having at least two different states of polarization, and the optical receiver provides the estimate of the ionizing-radiation dose based on received optical radiation as a function of the at least two different states of polarization.

25. The apparatus of claim 24, wherein the optical interrogation beam includes optical radiation at a plurality of wavelengths and the optical receiver is situated to receive reflected, transmitted, or scattered optical radiation from the ionizing-radiation-sensitive nanostructure and provide the estimate of the ionizing-radiation dose based on a reflectance change as a function of wavelength.

26. An apparatus, comprising:
an ionizing-radiation-sensitive optical nanostructure;
an optical radiation source that delivers an optical interrogation beam to the optical nanostructure; and
an optical receiver that receives at least a portion of the optical interrogation beam from the optical nanostructure and provides an estimate of an ionizing-radiation dose based on the received portion;
wherein the ionizing-radiation-sensitive optical nanostructure includes a plurality of templates that contain the ionizing-radiation-sensitive material.

27. The apparatus of claim 26, wherein the optical interrogation beam includes optical radiation at a plurality of wavelengths and the optical receiver provides the estimate of the ionizing-radiation dose based on received optical radiation as a function of wavelength.

28. The apparatus of claim 26, wherein the templates comprise a polymer or a metal oxide.

29. A method, comprising:
directing an optical interrogation beam to a nanostructure;
receiving a portion of the optical radiation from the nanostructure; and
determining an ionizing-radiation dose based on the received portion.

30. The method of claim 29, wherein the nanostructure is a nanomesh or a plurality of nanoshells.

31. The method of claim 29, further comprising determining whether the nanostructure has been tampered with based on the received portion.

32. A method, comprising:
measuring optical radiation received from at least one tag that is applied to an object at a plurality of wavelengths, the tag including a nanostructure; and
based on the received optical radiation, determining an exposure by the tag to a stimulus that corresponds to a change in a material property associated with the nanostructure; wherein the determining an exposure to a stimulus includes, based on the received optical radiation, determining an estimate of an ionizing-radiation dose received by the tag.

33. The method of claim 32, wherein the determining an exposure to a stimulus includes, based on the received optical radiation, determining if the object has been tampered with.

34. The method of claim 33, further wherein the at least one tag matches a visual appearance of at least one surface area of the object so as to be at least partially concealed.

35. The method of claim 33, further comprising determining if the object has been tampered with based on oxidation of at least a portion of the nanostructure.

36. The method of claim 33, wherein the nanostructure is a plurality of nanoshells or a nanomesh.

37. The method of claim 33, wherein the object is determined to have been tampered with without apparent visual change of the applied tags.

38. The method of claim 33, wherein the received optical radiation is detected at a plurality of wavelengths, and tampering is detected based on a principal component analysis of the optical power of the received optical radiation at the plurality of wavelengths.

39. The method of claim 32, wherein the nanostructure includes one or more layers that is ionizing-radiation-sensitive and tamper-sensitive.

40. The method of claim 33, wherein the determining an exposure to a stimulus includes, based on the received optical radiation, determining an estimate of an ionizing-radiation dose received by the tag.

* * * * *